United States Patent
Nakajima

(10) Patent No.: US 11,946,657 B2
(45) Date of Patent: Apr. 2, 2024

(54) ELECTRIC COMPONENT AND REFRIGERATION APPARATUS

(71) Applicant: DAIKIN INDUSTRIES, LTD., Osaka (JP)

(72) Inventor: Yuki Nakajima, Osaka (JP)

(73) Assignee: Daikin Industries, Ltd., Osaka (JP)

( * ) Notice: Subject to any disclaimer, the term of this patent is extended or adjusted under 35 U.S.C. 154(b) by 0 days.

(21) Appl. No.: 18/279,133

(22) PCT Filed: Mar. 17, 2022

(86) PCT No.: PCT/JP2022/012241
§ 371 (c)(1),
(2) Date: Aug. 28, 2023

(87) PCT Pub. No.: WO2022/209953
PCT Pub. Date: Oct. 6, 2022

(65) Prior Publication Data
US 2024/0035677 A1 Feb. 1, 2024

(30) Foreign Application Priority Data

Mar. 30, 2021 (JP) .................................. 2021-058039

(51) Int. Cl.
*F24F 1/24* (2011.01)
*H05K 1/02* (2006.01)
(Continued)

(52) U.S. Cl.
CPC ............. *F24F 1/24* (2013.01); *H05K 1/0204* (2013.01); *H05K 7/2039* (2013.01); *H05K 7/209* (2013.01);
(Continued)

(58) Field of Classification Search
CPC ....... F24F 1/24; H05K 1/0204; H05K 7/2039; H05K 7/209; H05K 2201/066; H01G 9/0003
See application file for complete search history.

(56) References Cited

U.S. PATENT DOCUMENTS

2008/0266811 A1 * 10/2008 Yamada ................. H05K 1/141
361/767

FOREIGN PATENT DOCUMENTS

CN 108650789 A * 10/2018 ................. F24F 1/24
EP 2840603 A1 * 2/2015 ................. F24F 1/24
(Continued)

OTHER PUBLICATIONS

International Search Report (PCT/ISA/210) issued in PCT/JP2022/012241, dated Jun. 14, 2022.
(Continued)

*Primary Examiner* — Emmanuel E Duke
(74) *Attorney, Agent, or Firm* — Birch, Stewart, Kolasch & Birch, LLP

(57) ABSTRACT

A technique for dissipating heat from a plurality of components is proposed. An electric component (1) includes a substrate (400), a first component (412), a second component (401), and a heat sink (31). The substrate (400) has a first surface (400b) and a second surface (400a) opposite to the first surface (400b). The first component (412) is disposed on a side of the first surface (400b). The second component (401) includes a body (401a) disposed on a side of the second surface (400a), and a lead (401b) that extends from the body (401a) through the second surface (400a) to the first surface (400b). The heat sink (31) is disposed on the side of the first surface (400b), and is used in common for
(Continued)

dissipation of heat from the body (401*a*) through the lead (401*b*) and dissipation of heat from the first component (412).

16 Claims, 5 Drawing Sheets

(51) Int. Cl.
  *H05K 7/20*   (2006.01)
  *H01G 9/00*   (2006.01)
(52) U.S. Cl.
  CPC ..... *H01G 9/0003* (2013.01); *H05K 2201/066* (2013.01)

(56) References Cited

FOREIGN PATENT DOCUMENTS

| JP | 5-77930 U | 10/1993 | |
| JP | 2536657 B2 * | 9/1996 | ......... H01L 23/4006 |
| JP | 11-287506 A | 10/1999 | |
| JP | 2007-123447 A | 5/2007 | |
| JP | 2012-74425 A | 4/2012 | |
| JP | 2012074425 A * | 4/2012 | ... H04L 2924/13056 |
| JP | 2013-127340 A | 6/2013 | |
| JP | 2015-177070 A | 10/2015 | |
| JP | 2018-14415 A | 1/2018 | |
| JP | 2019-83245 A | 5/2019 | |
| JP | 2019-125640 A | 7/2019 | |
| JP | 2019-128118 A | 8/2019 | |
| JP | 2019-169638 A | 10/2019 | |
| WO | WO 2013/084416 A1 | 6/2013 | |
| WO | WO-2020157871 A1 * | 8/2020 | ............... F24F 1/24 |

OTHER PUBLICATIONS

International Preliminary Report on Patentability and English translation of the Written Opinion of the International Searching Authority for International Application No. PCT/JP2022/012241, dated Oct. 12, 2023.

Japanese Office Action for corresponding Japanese Application No. 2021-058039, dated Oct. 23, 2023, with English translation.

* cited by examiner

F I G. 2
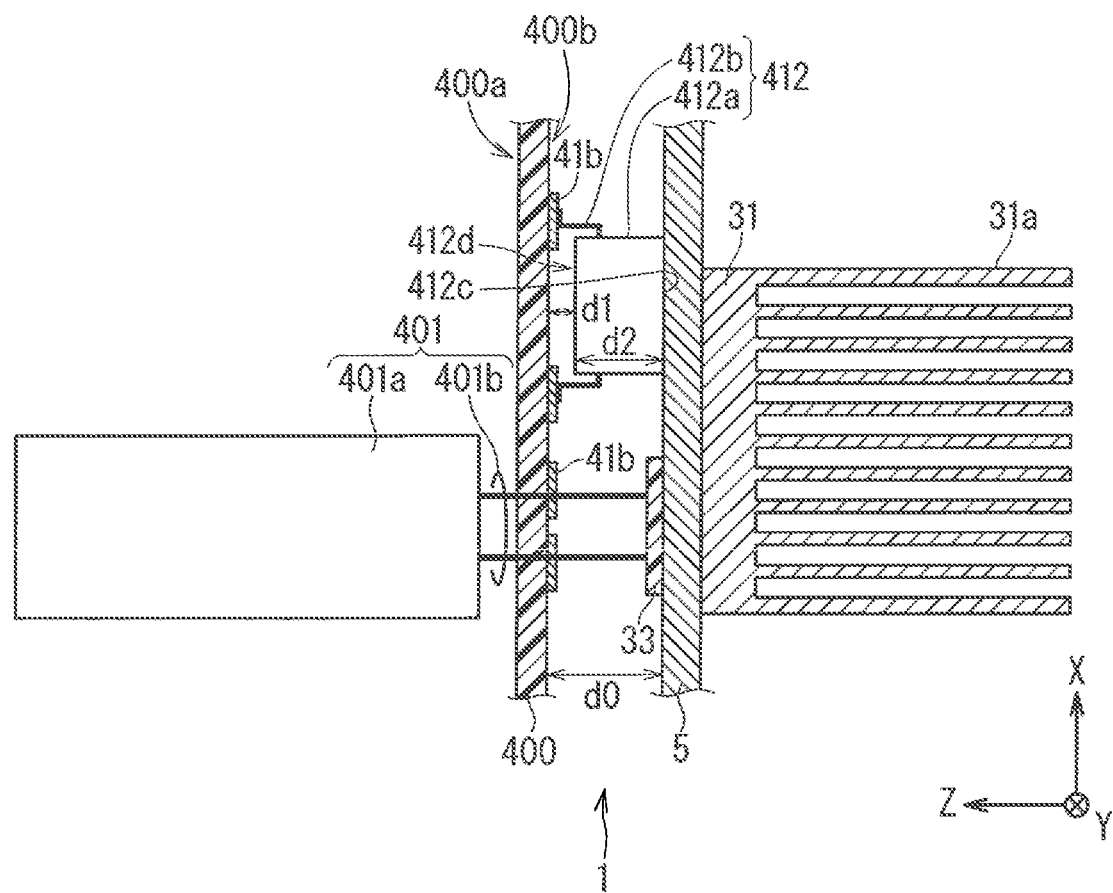

ELECTRIC COMPONENT AND REFRIGERATION APPARATUS

TECHNICAL FIELD

The present disclosure relates to an electric component and a refrigeration apparatus.

BACKGROUND ART

Japanese Unexamined Utility Model Application Publication No. 5-77930 states that when using an electrolytic capacitor, the life of the electrolytic capacitor is ensured by lowering the ambient temperature by using a fan or the like in general.

Japanese Unexamined Utility Model Application Publication No. 5-77930 discloses a cooling structure for an electrolytic capacitor. An electrode of the electrolytic capacitor is soldered to a copper foil on a printed circuit board. On the copper foil, heat dissipation fins are attached via an insulating material. The heat is conducted from the electrode to the heat dissipation fins through the copper foil, and is dissipated.

SUMMARY OF INVENTION

Technical Problem

A refrigeration apparatus includes, for example, a refrigeration circuit, an electric component that controls operation of the refrigeration circuit. The electric component includes, for example, a substrate on which an electronic circuit is mounted, and a housing (which is commonly referred to as an "electric component box") that accommodates the substrate and the electronic circuit. The electronic circuit includes, for example, a power module and an electrolytic capacitor. For example, the heat from the power module can be dissipated by a heat sink, and the electrolytic capacitor can be cooled by the air circulating in the housing.

The housing tends to be sealed for the purpose of reducing the entry of foreign matter and water droplets into the housing. The fact that the housing is sealed tends to reduce the amount of air for cooling the electrolytic capacitor. When such an amount of air decreases, the electrolytic capacitor is less efficiently cooled. Even if the electrolytic capacitor is less efficiently cooled, the electrolytic capacitor having a required life is expensive.

Even if the technique disclosed in Japanese Unexamined Utility Model Application Publication No. 5-77930 can be applied to the electrolytic capacitor in the electronic circuit, the mere combined use of the technique and a heat sink used for heat dissipation of a power module leads to an increase in component cost and/or an increase in the number of times of attachment of component.

The present disclosure proposes a technique for dissipating heat from a plurality of components.

Solution to Problem

A first aspect of an electric component (1) of the present disclosure includes a substrate (400), a first component (412), a second component (401), and a first heat dissipating member (31, 34). The substrate (400) has a first surface (400b) and a second surface (400a) opposite to the first surface. The first component (412) is disposed on a side of the first surface. The second component (401) includes a body (401a) disposed on a side of the second surface, and a protrusion (401b) that extends from the body through the second surface to the first surface. The first heat dissipating member (31, 34) is disposed on the side of the first surface, and is used in common for dissipation of heat from the body through the protrusion and dissipation of heat from the first component.

A second aspect of the electric component (1) of the present disclosure is the first aspect, and further includes a second heat dissipating member (33, 30) sandwiched between the first heat dissipating member (31, 34) and the protrusion (401b).

A third aspect of the electric component (1) of the present disclosure is the second aspect, in which the second component (401) that is singular has a plurality of the protrusions (401b). The second heat dissipating member is sandwiched between the first heat dissipating member (31, 34) and the plurality of the protrusions, and has an insulation property.

A fourth aspect of the electric component (1) of the present disclosure is any one of the first to third aspects, in which the second component is an electrolytic capacitor.

A fifth aspect of the electric component (1) of the present disclosure is any one of the first to third aspects, in which the second component is an inductive element.

A sixth aspect of the electric component (1) of the present disclosure is any one of the first to fifth aspects, in which the first component is a power module.

A seventh aspect of the electric component (1) of the present disclosure is the fourth aspect, and further includes a third component (403) disposed on the side of the second surface (400a). A distance (L1) between the second component and the first component is shorter than a distance (L2) between the second component and the third component, as viewed in a direction (Z) directed from the first surface toward the second surface.

An eighth aspect of the electric component (1) of the present disclosure is any one of the fourth to sixth aspects, in which the second component generates more heat than the first component, and an amount of heat conducted from the second component toward the first component is smaller than an amount of heat conducted from the second component toward a side opposite to the first component.

A first aspect of a refrigeration apparatus (19) of the present disclosure includes the electric component (1) of the present disclosure.

A second aspect of the refrigeration apparatus (19) of the present disclosure is the first aspect of the refrigeration apparatus of the present disclosure, and further includes a refrigeration circuit (9). The electric component (1) controls operation of the refrigeration circuit (9).

According to the electric component of the present disclosure, heat is dissipated from a plurality of components.

BRIEF DESCRIPTION OF DRAWINGS

FIG. 2 is a sectional view illustrating an electric component according to a first embodiment of the present disclosure.

DESCRIPTION OF EMBODIMENTS

Figure 1:
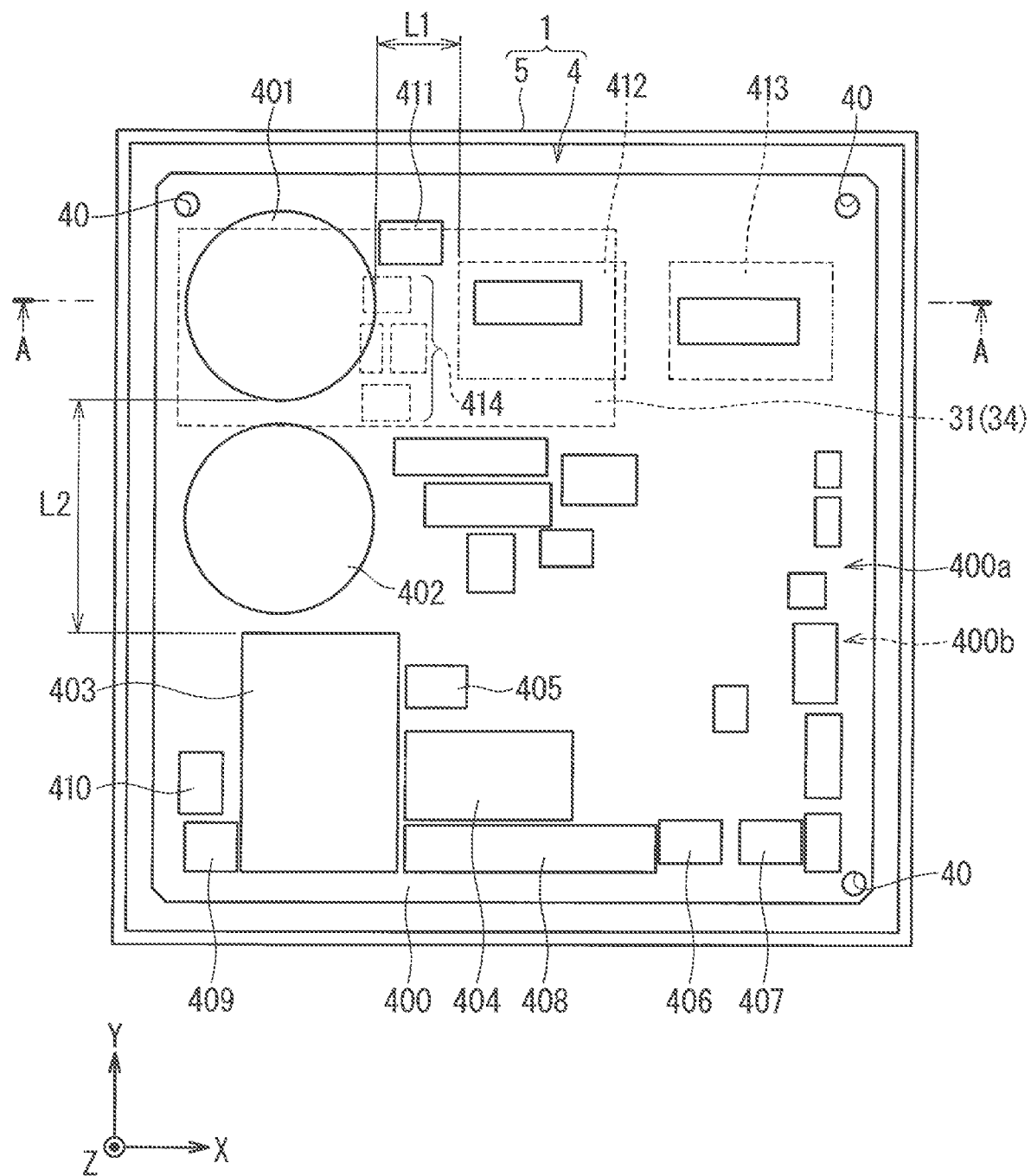
FIG. 1 is a plan view illustrating an electric component according to the present disclosure.

FIG. 1 is a plan view illustrating an electric component 1 according to the present disclosure. The electric component 1 includes a circuit board 4, a housing 5, and a heat sink 31 or a heat sink 34. The housing 5 accommodates the circuit board 4. In a case where the electric component 1 includes the heat sink 31, the heat sink 31 is located outside the housing 5. In a case where the electric component 1 includes the heat sink 34, part of the heat sink 34 is accommodated in the housing 5.

A case where the heat sink 31 is used will be described in first and second embodiments. A case where the heat sink 34 is used will be described in a third embodiment. Before each of the first to third embodiments is described, matters common to these embodiments will be described.

The circuit board 4 includes a substrate 400 and an electronic circuit mounted on the substrate 400. The electronic circuit includes components 401 to 414, and is realized by these components and circuit patterns not illustrated. Components not denoted by reference numerals in FIG. 1 also contribute to the realization of the electronic circuit, but are less relevant to the present disclosure, and thus, the description thereof is omitted.

The electric component 1 can be utilized, for example, in a circuit of an electrical system of an air conditioner. For example, the configuration of the air conditioner is divided into an outdoor unit and an indoor unit, and the electric component 1 is used in the outdoor unit.

The substrate 400 is insulative, except for the circuit patterns not illustrated, and has surfaces 400a and 400b. The surface 400a is opposite to the surface 400b. In FIG. 1, a direction Z indicates a direction directed from the surface 400b toward the surface 400a. In FIG. 1, the surface 400b is hidden by the surface 400a.

Directions X and Y are both orthogonal to the direction Z. The directions X and Y are orthogonal to each other. The directions X, Y, and, Z are regarded as directions of a so-called right-handed orthogonal coordinate system in this order.

Holes 40 pass through the substrate 400. The holes 40 are provided for fastening the substrate 400 and the housing 5. For example, fasteners (not illustrated) pass through the holes 40.

The components 401 to 411 are disposed on the substrate 400 on a side of the surface 400a. The components 412 to 414 are disposed on the substrate 400 on a side of the surface 400b. Components 401 to 411 may be disposed on the side of the surface 400b.

The components 401 and 402 are, for example, electrolytic capacitors. When the components 401 and 402 are exemplified as electrolytic capacitors, the components 401 and 402 are referred to hereinafter as electrolytic capacitors 401 and 402, respectively, in some cases. The component 403 is, for example, a common mode choke coil. When the component 403 is exemplified as a common mode choke coil, the component 403 is referred to hereinafter as a common mode choke coil 403 in some cases.

The component 404 is, for example, a relay, and controls whether to supply power to the electric component 1. The component 404 is referred to hereinafter as a switch 404 in some cases.

The components 405 and 406 are, for example, connectors, and the components 405 and 406 are referred to hereinafter as connectors 405 and 406, respectively, in some cases. The connectors 405 and 406 are, for example, provided for connection between the electric component 1 and an external alternating-current (AC) power source. FIG. 1 illustrates a case where the component 405 is provided beside the component 403 on a direction X side, and the component 406 is provided beside the component 408 on the direction X side. The component 408 is, for example, a fuse, and is referred to hereinafter as a fuse 408 in some cases.

The component 407 is, for example, a connector, and is provided for transferring a signal between an outdoor unit and an indoor unit (both not illustrated) of an air conditioner. The component 409 is, for example, a terminal, and a ground wire (not illustrated) is connected thereto. The components 410 and 411 are, for example, connectors, and reactors (not illustrated) not mounted on the substrate 400 are connected thereto. For example, the reactors are included in the electric component 1, and are accommodated in the housing 5.

Each of the components 412 and 413 is, for example, a power module. When the components 412 and 413 are exemplified as power modules, the components 412 and 413 are referred to hereinafter as power modules 412 and 413, respectively, in some cases. For example, the component 412 is an intelligent power module carrying a function of driving a fan not illustrated, and the component 413 is an intelligent power module carrying a function of driving a compressor not illustrated. Alternatively, for example, the component 412 is an intelligent power module carrying a function of driving a compressor not illustrated, and the component 413 is an intelligent power module carrying a function of driving a fan not illustrated.

In the first and second embodiments, the heat from the component 412 and the heat from the component 401 are dissipated in common by the heat sink 31. In the third embodiment, the heat from the component 412 and the heat from the component 401 are dissipated in common by the heat sink 34. In other words, each of the heat sinks 31 and 34 is used in common for heat dissipation of the component 412 and heat dissipation of the component 401.

The component 414 is, for example, a diode bridge, and FIG. 1 illustrates a case where four diodes illustrated by hidden outlines constitute the diode bridge.

First Embodiment

FIG. 2 is a sectional view partially illustrating the electric component 1 according to the first embodiment of the present disclosure. Part of a cross section viewed in the direction Y at location AA in FIG. 1 appears in FIG. 2. In FIG. 2, the illustration of the diodes constituting the diode bridge is omitted for the sake of simplification.

The electrolytic capacitor 401 includes a body 401a and a pair of leads 401b. The body 401a is disposed on the side of the surface 400a. The leads 401b can be regarded as protrusions that extend from the body 401a through the surface 400a to the surface 400b. The shape of the lead 401b is not limited to a linear shape, and may be a plate shape, for example.

The surface 400b is provided with conductive patterned films, for example, wiring patterns 41b. The pair of leads 401b are electrically connected to, for example, wiring patterns 41b different from each other by using, for example, solders not illustrated. Wiring patterns 41b different from each other may have different potentials. FIG. 2 illustrates a case where the leads 401b pass through the substrate 400 and the wiring patterns 41b. Alternatively, the surface 400a may be provided with conductive patterned films, for example, wiring patterns (not illustrated), and the leads 401b may be connected to the wiring patterns.

The power module 412 includes a body 412a and a plurality of leads 412b. The plurality of leads 412b are each electrically connected to a corresponding wiring pattern 41b by using, for example, a solder not illustrated.

The heat sink 31 is provided on the side of the surface 400b, outside the housing 5 (on a side opposite to the direction Z with respect to the housing 5 in FIG. 2). In FIG. 2, the heat sink 31 is provided so as to be in contact with the housing 5 from the outside of the housing 5. The heat sink 31 functions as a heat dissipating member that dissipates the heat from the electrolytic capacitor 401 and the power module 412 in common through the housing 5.

The heat from the electrolytic capacitor 401 and the heat from the power module 412 can be dissipated also by the wiring patterns 41b. Solders connecting the wiring patterns 41b and the electrolytic capacitor 401 may be interposed for the heat dissipation of the electrolytic capacitor 401 by the wiring patterns 41b. Solders connecting the wiring patterns 41b and the power module 412 may be interposed for the heat dissipation of the power module 412 by the wiring patterns 41b.

The heat sink 31 may be provided so as to be further longer in the direction X, and the heat from the power module 413 may also be dissipated by the heat sink 31 in the same manner as the power module 412. The heat sink 31 may be provided so as to be further longer on a side opposite to the direction Y, and the heat from the electrolytic capacitor 402 may be dissipated in the same manner as the electrolytic capacitor 401.

Specifically, in the power module 412, a surface (hereinafter, also referred to as a "top surface") 412c, which is a surface of the body 412a and located away from the leads 412b, is in contact with the housing 5 from the inner side of the housing 5. The housing 5 made of metal contributes to favorable heat dissipation of the power module 412 by the heat sink 31.

Specifically, the heat from the electrolytic capacitor 401 is dissipated by the heat sink 31 through the leads 401b. More specifically, the heat from the electrolytic capacitor 401 is dissipated by the heat sink 31 through the leads 401b and the housing 5.

The heat sink 31 faces at least part of the top surface 412c and the pair of leads 401b as viewed in the direction Z. The heat sink 31 is in contact with the housing 5 from the outside of the housing 5 from at least part of the top surface 412c to the pair of leads 401b as viewed in the direction X. Such a shape of the heat sink 31 contributes to the technique in which the heat sink 31 is used in common for heat dissipation of the body 401a through the leads 401b, and thus, heat dissipation of the electrolytic capacitor 401, and heat dissipation of the power module 412.

FIG. 2 illustrates a case where the electric component 1 further includes a heat dissipating member 33. The heat dissipating member 33 is accommodated in the housing 5. The heat dissipating member 33 is sandwiched between the heat sink 31 and the leads 401b. In this case, the heat from the electrolytic capacitor 401 is dissipated by the heat sink 31 through the leads 401b, the heat dissipating member 33, and the housing 5.

The housing 5 made of metal contributes to favorable heat dissipation of the electrolytic capacitor 401 through the leads 401b by the heat sink 31. The leads 401b and the housing 5 may be in contact with each other without interposing the heat dissipating member 33. The heat dissipating member 33 having an insulation property contributes to suppression of a short circuit between the pair of leads 401b. The heat dissipating member 33 having plasticity and/or flexibility contributes to favorable contact between the leads 401b and the heat dissipating member 33, contributes to favorable heat conduction between the leads 401b and the heat dissipating member 33, and thus, contributes to favorable heat dissipation of the electrolytic capacitor 401.

In the present embodiment, the heat sink 31 has a plurality of fins 31a extending from the housing 5 toward a side opposite to the direction Z. The plurality of fins 31a are separated from each other in the direction X. The heat sink 31 may have fins extending in a direction not parallel to the direction Z. Fins each having such a shape are exemplified in the second embodiment.

Second Embodiment

Figure 3:
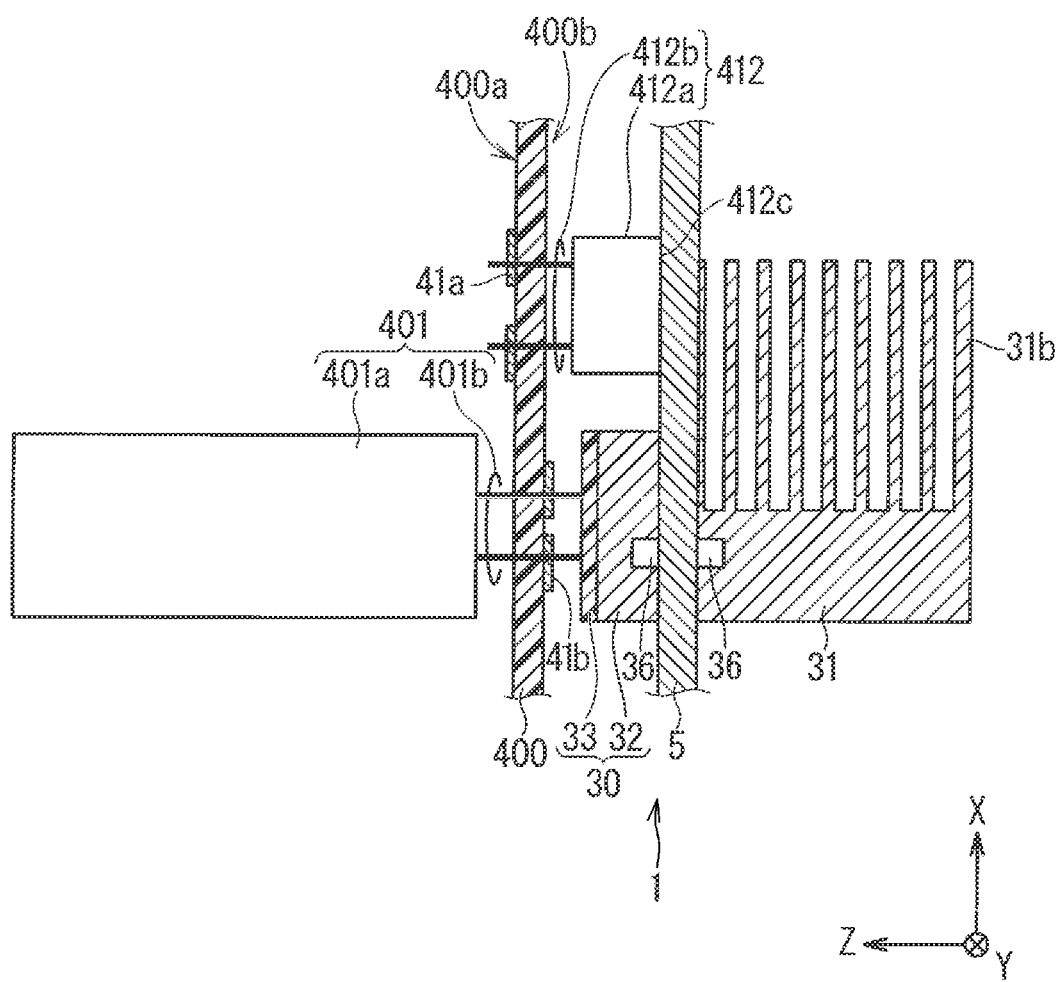
FIG. 3 is a sectional view illustrating an electric component according to a second embodiment of the present disclosure.

FIG. 3 is a sectional view partially illustrating the electric component 1 according to the second embodiment of the present disclosure. Part of a cross section viewed in the direction Y at location AA in FIG. 1 appears in FIG. 3.

The second embodiment exemplifies a case where the plurality of leads 412b extend from the body 412a through the surface 400b to the surface 400a.

The surface 400a is provided with conductive patterned films, for example, wiring patterns 41a. The plurality of leads 412b are each electrically connected to a corresponding wiring pattern 41a by using, for example, a solder not illustrated. FIG. 3 illustrates a case where the leads 412b pass through the substrate 400 and the wiring patterns 41a.

In the present embodiment, the electric component 1 further includes a heat dissipating member 32. The heat dissipating member 32 is sandwiched between the heat dissipating member 33 and the housing 5. The heat dissipating member 32 is accommodated in the housing 5. The housing 5 is sandwiched between the heat dissipating member 32 and the heat sink 31. In this case, the heat from the electrolytic capacitor 401 is dissipated by the heat sink 31 through the leads 401b, the heat dissipating members 32, 33, and the housing 5. For example, a gel sheet or silicone grease can be employed for the heat dissipating member 32. The heat dissipating member 32 functions as a heat spreader for heat conduction from the leads 401b to the heat sink 31.

Also in the present embodiment, similarly to the first embodiment, the heat sink 31 faces at least part of the top surface 412c and the pair of leads 401b as viewed in the direction Z. The heat sink 31 is in contact with the housing 5 from the outside of the housing 5 from at least part of the top surface 412c to the pair of leads 401b as viewed in the direction X.

The heat dissipating member 32 made of, for example, metal such as aluminum or aluminum alloy as a material, contributes to favorable heat dissipation of the electrolytic capacitor 401 through the leads 401b by the heat sink 31. The heat dissipating member 33 having an insulation property contributes to suppression of a short circuit between the pair of leads 401b when the heat dissipating member 32 is made of metal.

For example, the heat sink 31 and the heat dissipating member 32 are fastened to each other by a fastener 36 that passes through the housing 5. The fastener 36 made of metal contributes to favorable heat dissipation of the electrolytic capacitor 401 through the leads 401b by the heat sink 31 and the heat dissipating member 32.

For example, the heat dissipating members 32 and 33 are stacked in the Z direction. As viewed in the direction Z, the heat sink 31, the housing 5, the heat dissipating members 32, 33, and the leads 401b are disposed in this order. The heat dissipating members 32 and 33 can be collectively regarded as a single heat dissipating member 30. From the perspective of the leads 401b, the heat dissipating member 30 has an insulation property.

As compared with a case where only the heat dissipating member 33 is sandwiched between the leads 401b and the housing 5, in the present embodiment, the heat dissipating member 30 that can employ metal for the heat dissipating member 32 efficiently dissipates the heat from the electrolytic capacitor 401. The higher the location of the top surface 412c with respect to the substrate 400, the more significant this tendency becomes. This is because, in general, if the heat dissipating members have the same thickness in the direction Z, heat conduction of the heat dissipating member 33 when the heat dissipating member 33 has an insulation property is lower than heat conduction of the heat dissipating member 30 when metal is employed for the heat dissipating member 33. While it is conceivable to extend the leads 401b to be longer and reduce the thickness of the heat dissipating member 33, heat dissipation using the heat dissipating member 30 is more efficient in dissipating the heat from the electrolytic capacitor 401 than heat dissipation by the leads 401b.

In the present embodiment, the heat sink 31 has a plurality of fins 31b extending in the direction X. The plurality of fins 31b are separated from each other in the direction Z. Among the plurality of fins 31b, the fin 31b closest to the housing 5 is in contact with the housing 5 from the outside of the housing 5. For example, the heat sink 31 may have fins 31a described in the first embodiment.

Also in the present embodiment, similarly to the first embodiment, the plurality of leads 412b may each be connected to a corresponding wiring pattern 41b.

The heat sink 31 may be provided so as to be further longer in the direction X, and the heat from the power module 413 may also be dissipated by the heat sink 31 in the same manner as the power module 412. The heat sink 31 may be provided so as to be further longer on a side opposite to the direction Y, and the heat from the electrolytic capacitor 402 may be dissipated in the same manner as the electrolytic capacitor 401.

Third Embodiment

Figure 4:
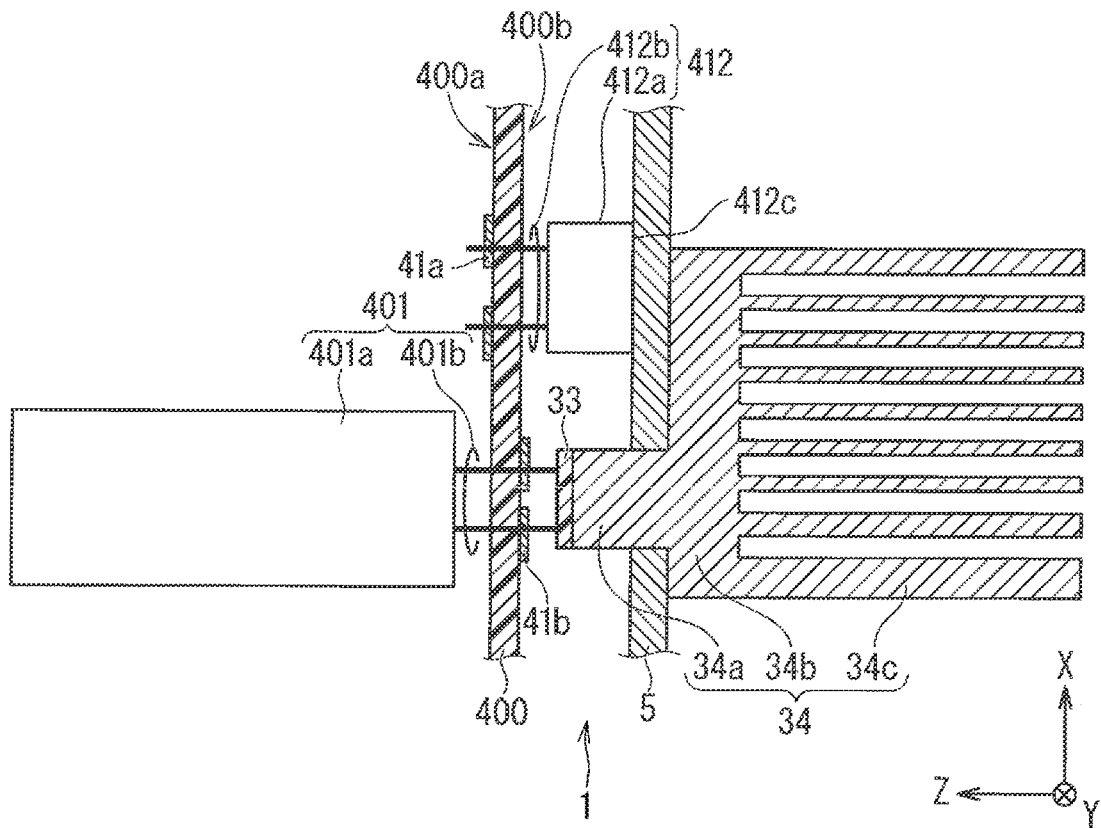
FIG. 4 is a sectional view illustrating an electric component according to a third embodiment of the present disclosure.

FIG. 4 is a sectional view partially illustrating the electric component 1 according to the third embodiment of the present disclosure. Part of a cross section viewed in the direction Y at location AA in FIG. 1 appears in FIG. 4.

Similarly to the second embodiment, the third embodiment also exemplifies a case where the plurality of leads 412b extend from the body 412a through the surface 400b to the surface 400a.

Also in the third embodiment, similarly to the second embodiment, the surface 400a is provided with the wiring patterns 41a, and the plurality of leads 412b are each electrically connected to a corresponding wiring pattern 41a by using, for example, a solder not illustrated. FIG. 4 illustrates a case where the leads 412b pass through the substrate 400 and the wiring patterns 41a.

In the present embodiment, the electric component 1 employs the heat sink 34 in place of the heat sink 31 described in the first and second embodiments.

The heat sink 34 includes a convex portion 34a, a base 34b, and a plurality of fins 34c. The convex portion 34a protrudes in the direction Z from the base 34b. The plurality of fins 34c extend on a side opposite to the direction Z from the base 34b.

The convex portion 34a passes through the housing 5 in the direction Z. On the side of the surface 400b and inside the housing 5 (on a direction Z side with respect to the housing 5 in FIG. 4), the convex portion 34a is in contact with the heat dissipating member 33.

The base 34b is provided so as to be in contact with the housing 5, outside the housing 5 (on a side opposite to the direction Z with respect to the housing 5 in FIG. 4). The heat sink 34 functions as a heat dissipating member that dissipates in common the heat from the electrolytic capacitor 401 without through the housing 5, and the heat from the power module 412 through the housing 5.

Although the power module 413 is omitted in FIG. 4 which is partially broken for the sake of simplification, the heat from the power module 413 is also dissipated by the heat sink 34 in the same manner as the power module 412. The heat from the electrolytic capacitor 402 may be dissipated in the same manner as the electrolytic capacitor 401.

The top surface 412c of the power module 412 is in contact with the inner side of the housing 5. The housing 5 made of metal contributes to favorable heat dissipation of the power module 412 by the heat sink 34.

Specifically, the heat from the electrolytic capacitor 401 is dissipated by the heat sink 34. More specifically, the heat from the electrolytic capacitor 401 is dissipated by the heat sink 34 through the leads 401b. The convex portion 34a and the base 34b function as a heat spreader for heat conduction from the leads 401b to the fins 34c.

The heat sink 34 faces at least part of the top surface 412c and the pair of leads 401b as viewed in the direction Z. The heat sink 34 is in contact with the housing 5 from at least part of the top surface 412c to the pair of leads 401b as viewed in the direction X. Such a shape of the heat sink 34 contributes to the technique in which the heat sink 34 is used in common for heat dissipation of the body 401a through the leads 401b, and thus, heat dissipation of the electrolytic capacitor 401, and heat dissipation of the power module 412.

FIG. 4 illustrates a case where the electric component 1 further includes the heat dissipating member 33. The heat dissipating member 33 is sandwiched between the convex portion 34a and the leads 401b. In this case, the heat from the electrolytic capacitor 401 is dissipated by the heat sink 34 through the leads 401b and the heat dissipating member 33. The heat dissipating member 33 having an insulation property contributes to suppression of a short circuit between the pair of leads 401b.

The heat sink 34 functioning as a heat dissipating member used in common for heat dissipation of the body 401a through the leads 401b and heat dissipation of the power module 412 contributes to heat dissipation of the electrolytic capacitor 401 and the power module 412 as a plurality of components.

The plurality of fins 34c are separated from each other in the direction X. The heat sink 34 may have fins extending in a direction not parallel to the direction Z.

For example, the convex portion 34a is a rectangular parallelepiped having two surfaces parallel to each other and parallel to the direction Z. For example, each of the plurality of fins 34c having two surfaces parallel to the said two surfaces contributes to the ease of forming the convex portion 34a and the plurality of fins 34c by punching from a metal block.

For example, the heat dissipating member 33 and the convex portion 34a are stacked in the direction Z. As viewed in the direction Z, the fins 34c, the base 34b, the convex portion 34a, the heat dissipating member 33, the leads 401b are disposed in this order.

In the same manner as the case where the heat dissipating member 32 described in the second embodiment is made of metal, as compared with a case where only the heat dissipating member 33 is sandwiched between the leads 401b and the housing 5, the heat sink 34 efficiently dissipates the heat from the electrolytic capacitor 401. The higher the location of the top surface 412c with respect to the substrate 400, the more significant this tendency becomes.

Also in the present embodiment, similarly to the first embodiment, the plurality of leads 412b may each be connected to a corresponding wiring pattern 41b.

The heat sink 34 may be provided so as to be further longer in the direction X, and the heat from the power module 413 may also be dissipated by the heat sink 34 in the same manner as the power module 412. The heat sink 34 may be provided so as to be further longer on a side opposite to the direction Y, and the heat from the electrolytic capacitor 402 may be dissipated in the same manner as the electrolytic capacitor 401.

The convex portion 34a may be provided so as to be further longer in the direction X, and the heat from the top surface 412c of the power module 412 may be dissipated not through the housing 5, but through the convex portion 34a. The heat dissipating member 33 may be interposed between the top surface 412c and the convex portion 34a, or the top surface 412c and the convex portion 34a may be in direct contact with each other. The heat from the power module 413 may be dissipated in the same manner. In a case where heat conduction of the heat sink 34 is more favorable than that of the housing 5, such modification contributes to an improvement in heat dissipation efficiency.

From the contents described in the first to third embodiments, the following is understood: the heat sink 31 (or the heat sink 34) functioning as a heat dissipating member disposed on the side of the surface 400b and used in common for heat dissipation of the body 401a through the leads 401b and heat dissipation of the power module 412 contributes to heat dissipation of a plurality of the components 401 and 412; and employment of the heat sink 31 (or the heat sink 34) contributes to at least one of a reduction in component cost and a decrease in the number of times of attachment of component, as compared with a case where a heat sink is provided for each of the components 401 and 412.

Fourth Embodiment

The present embodiment will be described with reference to FIG. 1. When viewed in the direction Z directed from the surface 400b toward the surface 400a, the electrolytic capacitor 401 and the power module 412 are separated from each other by a distance L1. When viewed in the direction Z, the electrolytic capacitor 401 and the common mode choke coil 403 are separated from each other by a distance L2.

An AC voltage is applied to the electrolytic capacitor 401 via the connector 406, the fuse 408, the switch 404, and the common mode choke coil 403.

The electrolytic capacitor 401 disposed on the surface 400a and the power module 412 disposed on the surface 400b contributes to disposing the electrolytic capacitor 401 and the power module 412 close to each other, in other words, shortening the distance L1. Shortening the distance L1 contributes to, for example, a reduction in the space occupied by the substrate 400, and thus, a reduction in size of the electric component 1. Shortening the distance L1 contributes to, for example, a reduction in noise generated in a path through which a direct-current voltage supplied from the electrolytic capacitor 401 to the power module 412 is transmitted. Increasing the distance L2 contributes to, for example, suppressing transmission of noise, included in the AC voltage, to the power module 412 through a path that does not pass through the component 403. Increasing the distance L2 contributes to, for example, suppressing outflow of noise, generated from the power module 412 and/or the power module 413, to the AC power source (not illustrated) connected to the electric component 1 through a path that does not pass through the component 403. From such viewpoints, the present embodiment proposes that the distance L1 is shorter than the distance L2.

Even if the component 403 is a normal mode choke coil, the effect that noise is hardly transmitted can be obtained.

Fifth Embodiment

For example, the components 401 and 402 may be inductive elements. Examples of inductive elements include common mode choke coils, normal mode choke coils, and onboard reactors.

When the components 401 and 402 are inductive elements, there may be a case where the components 401 and 402 generate more heat than the power module 412. In such a case, for example, the fact that the amount of heat conducted from the components 401 and 402 toward the power module 412 is smaller than the amount of heat conducted from the components 401 and 402 toward the side opposite to the power module 412 contributes to mitigating a rise in temperature around the power module 412. In the context of FIG. 1, for example, the amount of heat conducted from the component 401 in the direction X is smaller than the amount of heat conducted from the component 401 on the side opposite to the direction X. In general, air with a high temperature tends to rise spatially, and as an example in which the relationship of the conductive heat amounts described above is obtained, there is a case where the direction X is directed spatially downward from the horizontal plane.

The present embodiment may be applied to a case where the components 401 and 402 may be electrolytic capacitors.

MODIFICATIONS

For example, the heat sinks 31 and 34 may each face the entire top surface 412c and the pair of leads 401b as viewed in the direction Z. For example, the heat sinks 31 and 34 may each be in contact with the housing 5 from the entire top surface 412c to the pair of leads 401b as viewed in the direction X.

Examples of the component 412 include a field effect transistor, an insulated gate bipolar transistor, a diode, a diode bridge, and a converter module, in addition to an intelligent power module.

The component 412 may have a form without the leads 412b. For example, the component 412 may be a chip component.

The component 412 having a small thickness in the direction Z contributes to the ease of thinning the heat dissipating member 32 and/or the heat dissipating member 33. The thin heat dissipating member 32 and/or the thin heat dissipating member 33 contributes to heat dissipation of the body 401a through the leads 401b, and thus, heat dissipation of the component 401. For example, a distance between distal ends of the leads 401b on a side opposite to the body 401a and the top surface 412c in the direction Z is less than or equal to 5 mm, and more preferably less than or equal to 3 mm.

For example, the body 412a has a bottom surface 412d on a side opposite to the top surface 412c in the direction Z (see FIG. 2). A distance d1 between the bottom surface 412d and the surface 400b in the direction Z is, for example, smaller than a distance d0 between the surface 400b and the housing 5 in the direction Z. A distance d2 between the top surface 412c and the bottom surface 412d in the direction Z is, for example, equal to a difference between the distance d0 and the distance d1.

Figure 5:
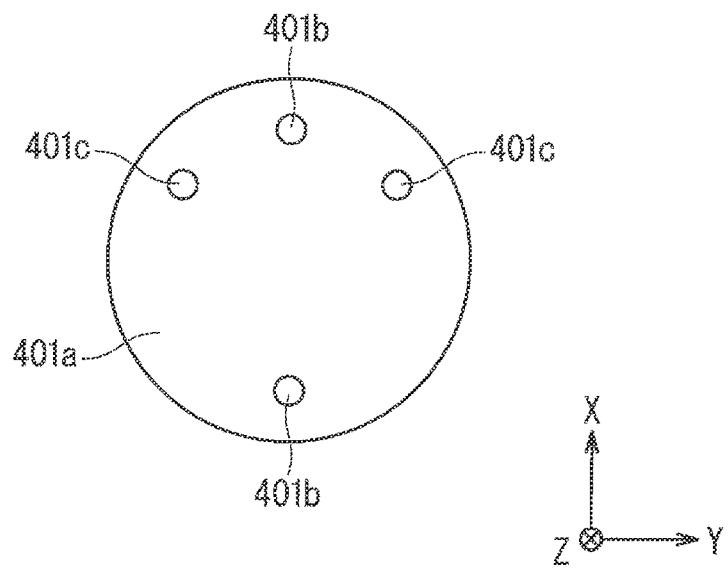
FIG. 5 is a side view illustrating protrusions of a component.

For example, the component 401 may have a protrusion that extends from the body 401a through the surface 400a to the surface 400b, in addition to the leads 401b. The protrusion is not necessarily limited to a case of functioning as an electrode. The protrusion has, for example, a function of suppressing shaking of the component 401. The protrusion may be interposed for heat dissipation of the body 401a by the heat sink 31 (or the heat sink 34) together with the leads 401b or in place of the leads 401b. FIG. 5 is a side view illustrating protrusions 401c of the component 401 when viewed in the direction Z. The protrusions 401c extend from a body 401a in a direction opposite to the direction Z. The protrusions 401c may pass through the surface 400b to the housing 5 or the heat dissipating member 33.

Another heat dissipating member may be sandwiched between the component 412 and the heat sink 31 (or the heat sink 34). For example, a heat dissipating member having an insulation property is sandwiched between the top surface 412c and the housing 5. Heat dissipation of a component utilizing such a heat dissipating member is understood from, for example, Japanese Patent Application Laid-Open No. 2019-83245, and thus, the detailed description thereof is omitted.

APPLICATION EXAMPLE

Figure 6:
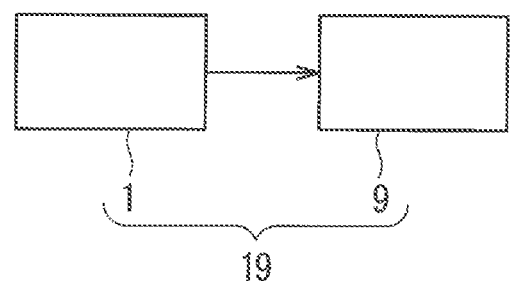
FIG. 6 is a block diagram illustrating a refrigeration apparatus according to the present disclosure.

FIG. 6 is a block diagram illustrating a refrigeration apparatus 19 according to the present disclosure. The electric component 1 is applied to the refrigeration apparatus 19. The refrigeration apparatus 19 includes the electric component 1 described above. More specifically, the refrigeration apparatus 19 includes the electric component 1 and a refrigeration circuit 9. The refrigeration circuit 9 includes actuators, for example, a compressor, a fan, and an expansion valve. The electric component 1 controls the operation of the refrigeration circuit 9, for example, each of these actuators. The control is schematically illustrated by an arrow in FIG. 6.

The embodiments have been described above, and it will be understood that various changes in form and detail are possible without departing from the spirit and scope of the patent claims. The various embodiments and modifications described above can be combined with each other.

REFERENCE SIGNS LIST

1 Electric component
9 Refrigeration circuit
31, 34 Heat sink
33, 30 Heat dissipating member
19 Refrigeration apparatus
400 Substrate
400a, 400b Surface
401, 403, 412 Component
401a Body
401b Lead
L1, L2 Distance
Z Direction

The invention claimed is:

1. An electric component comprising:
   a substrate having a first surface and a second surface opposite to the first surface;
   a first component disposed on a side of the first surface;
   a second component including a body disposed on a side of the second surface, and a protrusion that extends from the body through the second surface to the first surface; and
   a first heat dissipating member disposed on the side of the first surface, and used in common for dissipation of heat from the body through the protrusion and dissipation of heat from the first component.

2. The electric component according to claim 1, further comprising a second heat dissipating member sandwiched between the first heat dissipating member and the protrusion.

3. The electric component according to claim 2, wherein the second component that is singular has a plurality of the protrusions, and the second heat dissipating member is sandwiched between the first heat dissipating member and the plurality of the protrusions, and has an insulation property.

4. The electric component according to claim 1, wherein the second component is an electrolytic capacitor.

5. The electric component according to claim 4, further comprising
   a third component disposed on the side of the second surface, wherein
   a distance between the second component and the first component is shorter than a distance between the second component and the third component, as viewed in a direction directed from the first surface toward the second surface.

6. The electric component according to claim 4, wherein the second component generates more heat than the first component, and
   an amount of heat conducted from the second component toward the first component is smaller than an amount of heat conducted from the second component toward a side opposite to the first component.

7. The electric component according to claim 1, wherein the second component is an inductive element.

8. The electric component according to claim 1, wherein the first component is a power module.

9. A refrigeration apparatus, comprising:
   a refrigeration circuit; and
   an electric component that controls operation of the refrigeration circuit,
   the electric component including:
   a substrate having a first surface and a second surface opposite to the first surface:
   a first component disposed on a side of the first surface;
   a second component including a body disposed on a side of the second surface, and a protrusion that extends from the body through the second surface to the first surface; and
   a first heat dissipating member disposed on the side of the first surface, and used in common for dissipation of heat from the body through the protrusion and dissipation of heat from the first component.

10. The refrigeration apparatus according to claim 9, the electric component further including
a second heat dissipating member sandwiched between the first heat dissipating member and the protrusion.

11. The refrigeration apparatus according to claim 10, wherein
the second component that is singular has a plurality of the protrusions, and
the second heat dissipating member is sandwiched between the first heat dissipating member and the plurality of the protrusions, and has an insulation property.

12. The refrigeration apparatus according to claim 9, wherein the second component is an electrolytic capacitor.

13. The refrigeration apparatus according to claim 12, the electric component further including
a third component disposed on the side of the second surface, wherein
a distance between the second component and the first component is shorter than a distance between the second component and the third component, as viewed in a direction directed from the first surface toward the second surface.

14. The refrigeration apparatus according to claim 12, wherein
the second component generates more heat than the first component, and
an amount of heat conducted from the second component toward the first component is smaller than an amount of heat conducted from the second component toward a side opposite to the first component.

15. The refrigeration apparatus according to claim 1, wherein the second component is an inductive element.

16. The refrigeration apparatus according to claim 9, wherein the first component is a power module.

* * * * *